United States Patent
Liu et al.

(10) Patent No.: US 9,281,382 B2
(45) Date of Patent: Mar. 8, 2016

(54) METHOD FOR MAKING SEMICONDUCTOR DEVICE WITH ISOLATION PILLARS BETWEEN ADJACENT SEMICONDUCTOR FINS

(71) Applicants: STMICROELECTRONICS, INC., Coppell, TX (US); GLOBALFOUNDRIES Inc., Grand Cayman (KY); INTERNATIONAL BUSINESS MACHINES CORPORATION, Armonk, NY (US)

(72) Inventors: Qing Liu, Watervliet, NY (US); Ruilong Xie, Schenectady, NY (US); Xiuyu Cai, Niskayuna, NY (US); Chun-chen Yeh, Clifton Park, NY (US)

(73) Assignees: STMICROELECTRONICS, INC., Coppell, TX (US); GLOBALFOUNDRIES INC, Grand Cayman (KY); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/295,618

(22) Filed: Jun. 4, 2014

(65) Prior Publication Data

US 2015/0357439 A1 Dec. 10, 2015

(51) Int. Cl.
| | |
|---|---|
| *H01L 21/00* | (2006.01) |
| *H01L 21/84* | (2006.01) |
| *H01L 29/66* | (2006.01) |
| *H01L 29/78* | (2006.01) |
| *H01L 29/06* | (2006.01) |
| *H01L 21/762* | (2006.01) |

(52) U.S. Cl.
CPC .... *H01L 29/66795* (2013.01); *H01L 21/76224* (2013.01); *H01L 29/0649* (2013.01); *H01L 29/785* (2013.01)

(58) Field of Classification Search
CPC .......................... H01L 29/785; H01L 27/1214
USPC ........... 438/151, 157, 164; 257/308, 331, 385
See application file for complete search history.

(56) References Cited

U.S. PATENT DOCUMENTS 9,070,742 B2 * 6/2015 Xie et al.

OTHER PUBLICATIONS

U.S. Appl. No. 14/182,601, filed Feb. 18, 2014.

* cited by examiner

*Primary Examiner* — Theresa T Doan
(74) *Attorney, Agent, or Firm* — Allen, Dyer, Doppelt, Milbrath & Gilchrist, P.A.

(57) ABSTRACT

A method for making a semiconductor device may include forming, above a substrate, a plurality of laterally spaced-apart semiconductor fins, and forming regions of a first dielectric material between the laterally spaced-apart semiconductor fins. The method may further include selectively removing at least one intermediate semiconductor fin from among the plurality of semiconductor fins to define at least one trench between corresponding regions of the first dielectric material, and forming a region of a second dielectric material different than the first dielectric in the at least one trench to provide at least one isolation pillar between adjacent semiconductor fins.

23 Claims, 10 Drawing Sheets

METHOD FOR MAKING SEMICONDUCTOR DEVICE WITH ISOLATION PILLARS BETWEEN ADJACENT SEMICONDUCTOR FINS

FIELD OF THE INVENTION

The present invention relates to the field of electronic devices and, more particularly, to semiconductor devices and related methods.

JOINT RESEARCH AGREEMENT

The claimed configurations set forth herein were made as a result of activities undertaken within the scope of a joint research agreement. The parties to the joint research agreement are (1) STMicroelectronics, Inc., and (2) International Business Machines Corporation.

BACKGROUND OF THE INVENTION

Fin-based field effect transistors (FINFETs) are vertical transistor devices in which a semiconductor fin is located on a substrate and is used to define the channel region of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

With ever-increasing device integration densities, (e.g., 10 nm and beyond), various challenges may arise with respect to FINFET semiconductor devices. For example, with increasing densities, the distances between adjacent devices becomes smaller, making the chances for inadvertent shorting between them greater. As such, further enhancements in semiconductor devices may be desirable in some applications, such as next generation FINFET devices with relatively small dimensions, for example.

SUMMARY OF THE INVENTION

A method for making a semiconductor device may include forming, above a substrate, a plurality of laterally spaced-apart semiconductor fins, and forming regions of a first dielectric material between the laterally spaced-apart semiconductor fins. The method may further include selectively removing at least one intermediate semiconductor fin from among the plurality of semiconductor fins to define at least one trench between corresponding regions of the first dielectric material, and forming a region of a second dielectric material different than the first dielectric material in the at least one trench to provide at least one isolation pillar between adjacent semiconductor fins.

More particularly, selectively removing the at least one intermediate semiconductor fin may include selectively removing a group of adjacent intermediate semiconductor fins, and the at least one isolation pillar may include a group of spaced-apart isolation pillars. Furthermore, the method may also include selectively removing portions of the first dielectric material to widen the at least one trench after selectively removing the at least one intermediate semiconductor fin. The method may further include removing upper portions of the regions of the first dielectric material so that the semiconductor fins and the at least one isolation pillar extend above the regions of the first dielectric material.

By way of example, the first dielectric material may comprise silicon dioxide, and the second dielectric material may comprise aluminum oxide. The method may also include forming a gate overlying the semiconductor fins and the at least one isolation pillar. Moreover, a pair of source and drain regions may be formed on opposing ends of at least one semiconductor fin.

In addition, selectively removing the at least one intermediate semiconductor fin may include forming a mask layer above the semiconductor fins and exposing the at least one intermediate semiconductor fin, and removing the at least one semiconductor fin through the mask layer. By way of example, the plurality of semiconductor fins may comprise silicon, and the substrate may comprise a semiconductor substrate.

A related semiconductor device may include a substrate, a plurality of laterally spaced-apart semiconductor fins above the substrate, and a first dielectric material between the laterally spaced-apart semiconductor fins. Further, at least one isolation pillar may be between the laterally spaced-apart semiconductor fins, the at least one isolation pillar comprising a second dielectric material different than the first dielectric material.

DETAILED DESCRIPTION OF THE PREFERRED EMBODIMENTS

Figure 1:
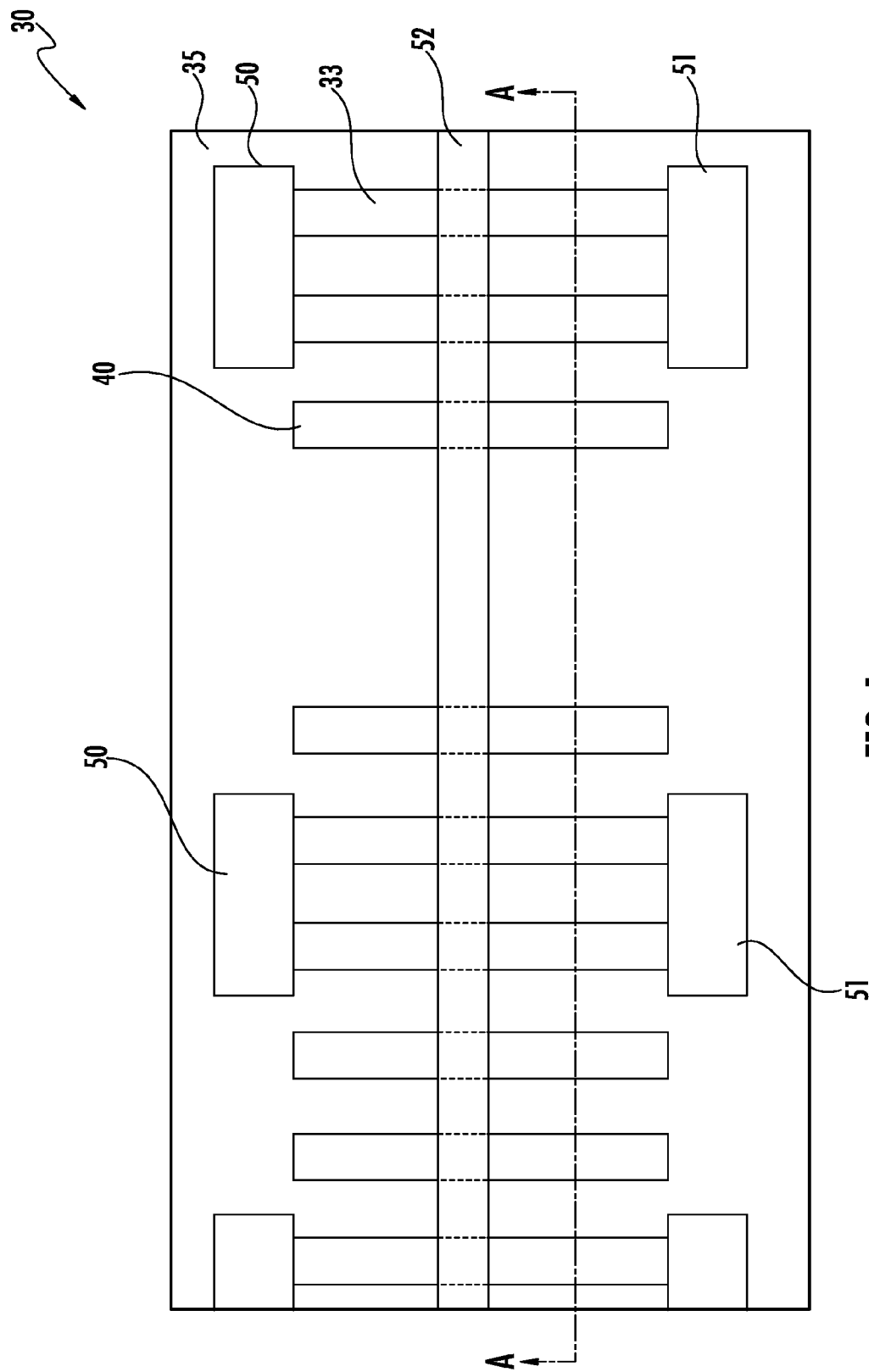
FIG. 1 is a top view of a semiconductor FINFET device in accordance with an example embodiment including isolation pillars between adjacent transistors.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similarly elements in different embodiments.

By way of background, FINFET devices may provide desired short channel control to enable technology scaling down to 10 nm nodes and beyond. A source/drain in-situ doped epitaxial merge process may be used to connect the fins outside of the gate for lowering the source/drain spreading resistance, and to provide a relatively flat topography for source/drain contact landings, as will be appreciated by those skilled in the art. One potential drawback of this lateral epitaxial growth in complementary devices is that in the boundary region between N-type and P-type transistors, relaxed or wider spacing may otherwise be required to keep epitaxial growth from shorting fins from the N-type and P-type transistors together. More particularly, due to the loading effects, the fins tend to experience more epitaxial growth, which may make it challenging to achieve desired growth in the source/drain regions without inter-fin growth that results in shorting. However, increasing the spacing between N-type and P-type devices reduces the amount of available surface area or "real estate", and accordingly restricts chip area scaling, especially in ultra-dense SRAM arrays, for example.

One approach to providing adequate isolation between fins of adjacent N-type and P-type transistors, without an excessive loss of surface area from spacing the transistors too far apart, is to grow raised shallow trench isolation (STI) regions between adjacent transistors to help prevent shorts between these adjacent devices. However, it may be difficult to accurately control the positioning of the raised STI regions due to lithography alignment capabilities. More particularly, at smaller processing nodes, it may be challenging to precisely align the lithography/photoresist to pattern an STI region precisely between adjacent N-type and P-type devices. For example, if the STI pillar gets too close to a fin this may undesirably increase the "on" resistance for that particular device. Moreover, if the STI pillar is in contact with a fin, this may damage the fin and potentially lead to device failure.

Generally speaking, a self-aligned "dummy fin" approach is set forth herein to help prevent epitaxial lateral growth in the N/P transistor boundary regions, to thereby help enable further chip area scaling to lower processing nodes. It should be noted, however, that the techniques set forth herein are not reserved for isolating N and P-type (i.e., complementary) devices, but may also be used for isolating devices of a same conductivity type, for example.

Figure 2:
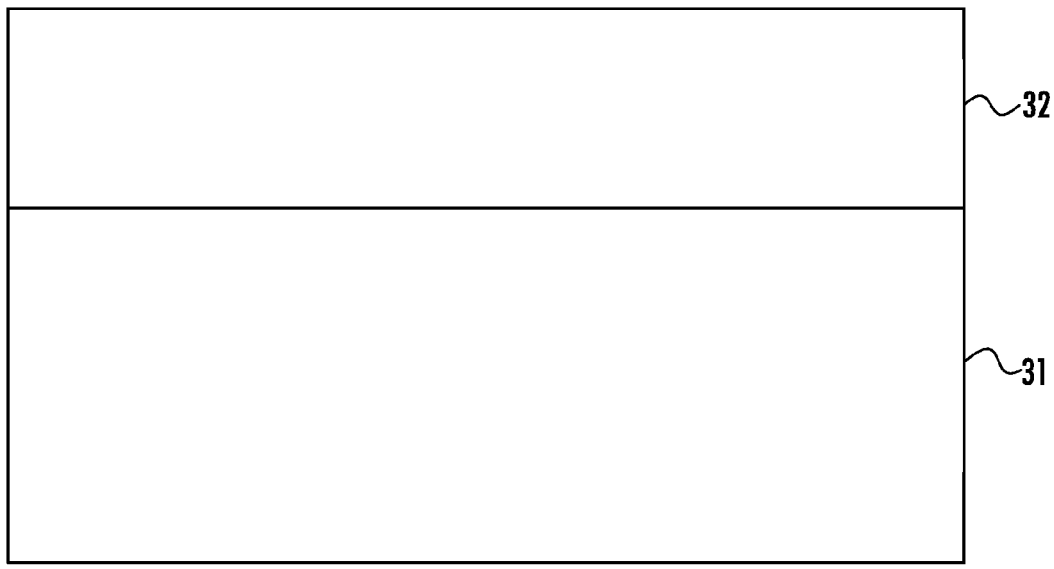
FIGS. 2-15 are a series of cross-sectional views taken along line A-A of FIG. 1 and illustrating a method of making the semiconductor FINFET device shown therein.
Figure 3:
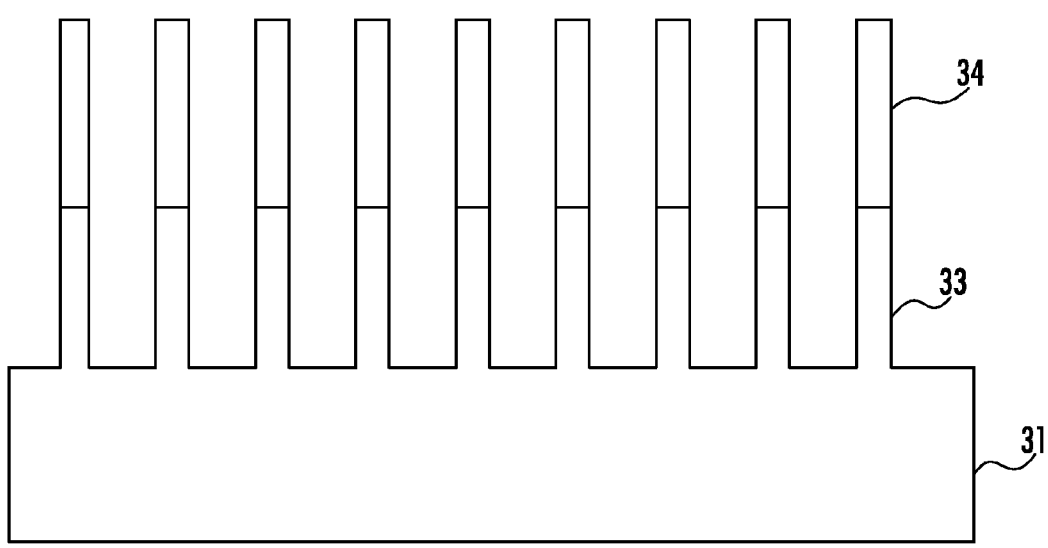
Figure 4:
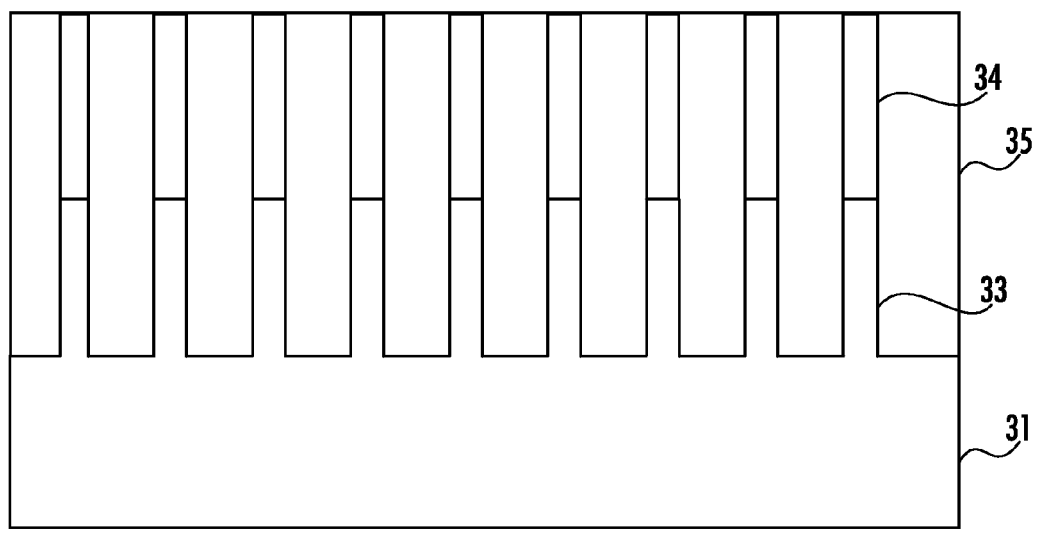

Referring initially to FIGS. 1-2, a semiconductor FINFET device 30 and associated method for making the semiconductor device are first described. On a semiconductor substrate 31 (e.g., silicon), a hard mask 32 (e.g., silicon nitride, SiN) is formed. A fin patterning/etching step may then be performed, as seen in FIG. 3, to define a plurality of semiconductor fins 33 and residual nitride portions 34, as will be appreciated by those skilled in the art. An oxide 35 (e.g., $SiO_2$) may then be filled over and between the fins 33/residual nitride portions 34, and planarized (e.g., by chemical mechanical polishing, CMP) at the upper surfaces of the residual nitride portions, as seen in FIG. 4.

Figure 5:
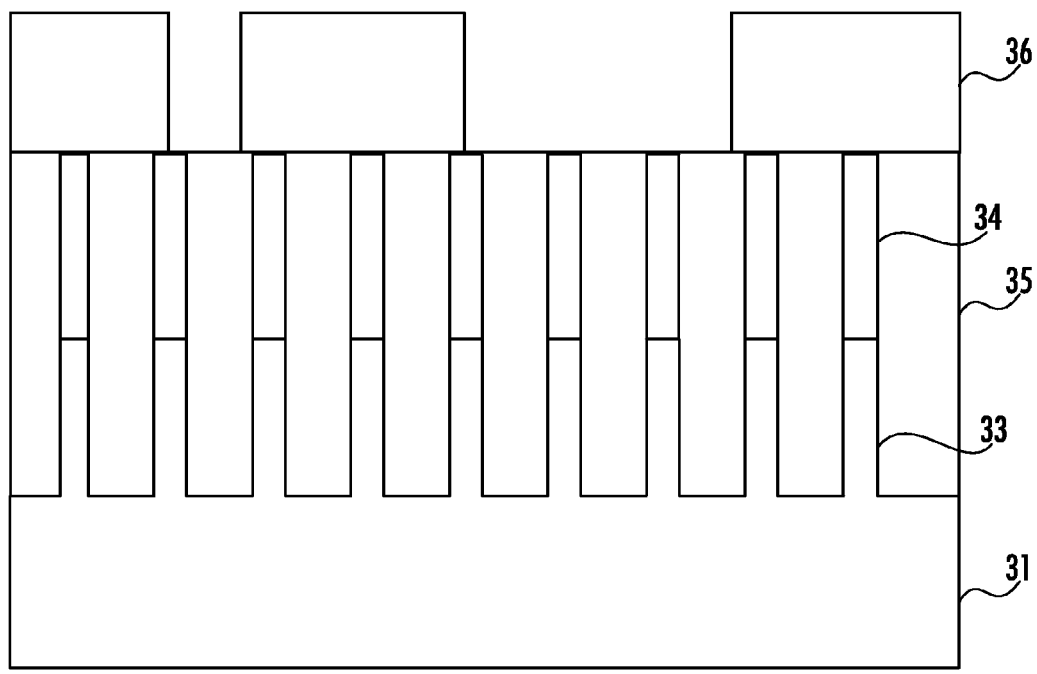

A photomask 36 may then be formed (FIG. 5) covering the fins 33 and corresponding residual nitride portions 34 that are to remain, and exposing those that are to be removed via photolithography patterning. As shown in this example, the openings in the photomask 36 are not precisely aligned with the fins 33/residual nitride portions 34 that are to be etched away. This may otherwise present a problem if one were attempting to selectively replace certain fins 33 with a raised STI region at this point, as the relatively imprecise alignment of the photomask 36 opening may result in the STI region being in contact with (or almost in contact with) adjacent fins, leading to the problems discussed above.

Figure 6:
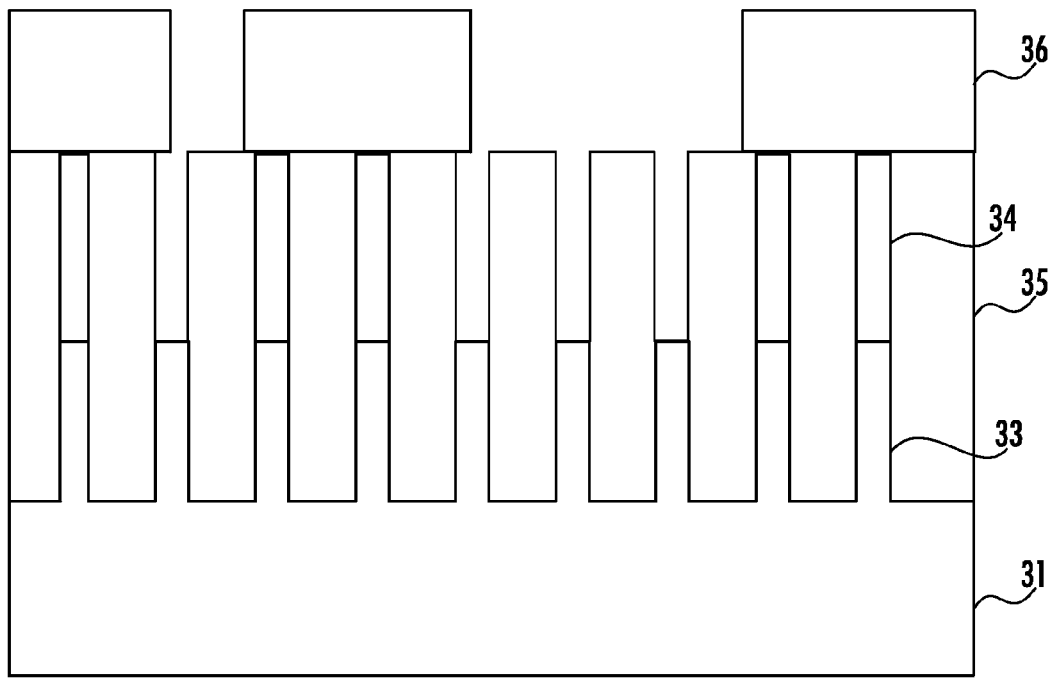
Figure 7:
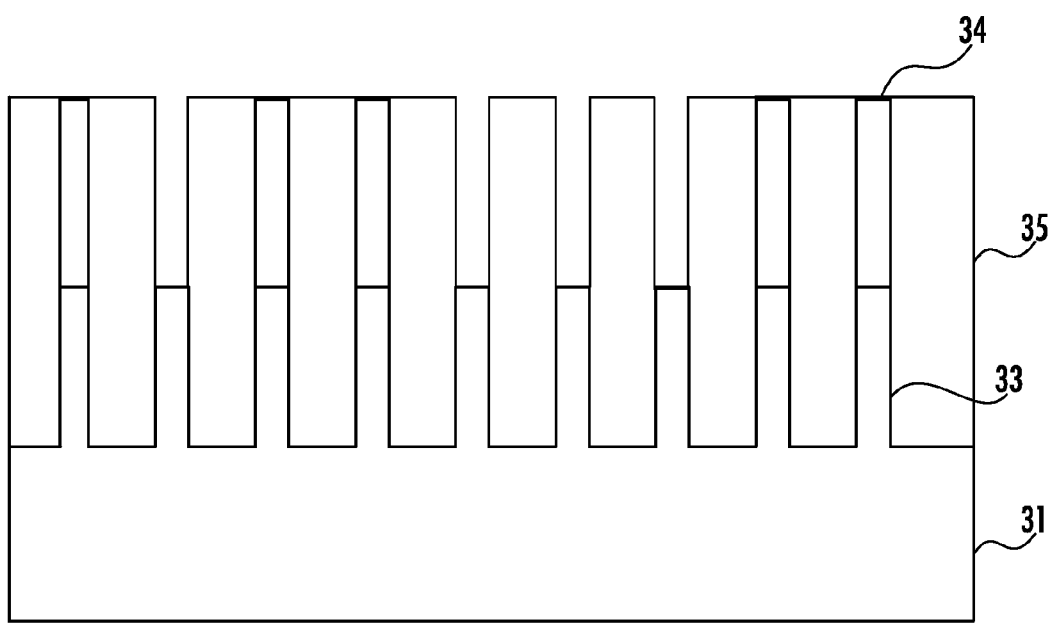
Figure 8:
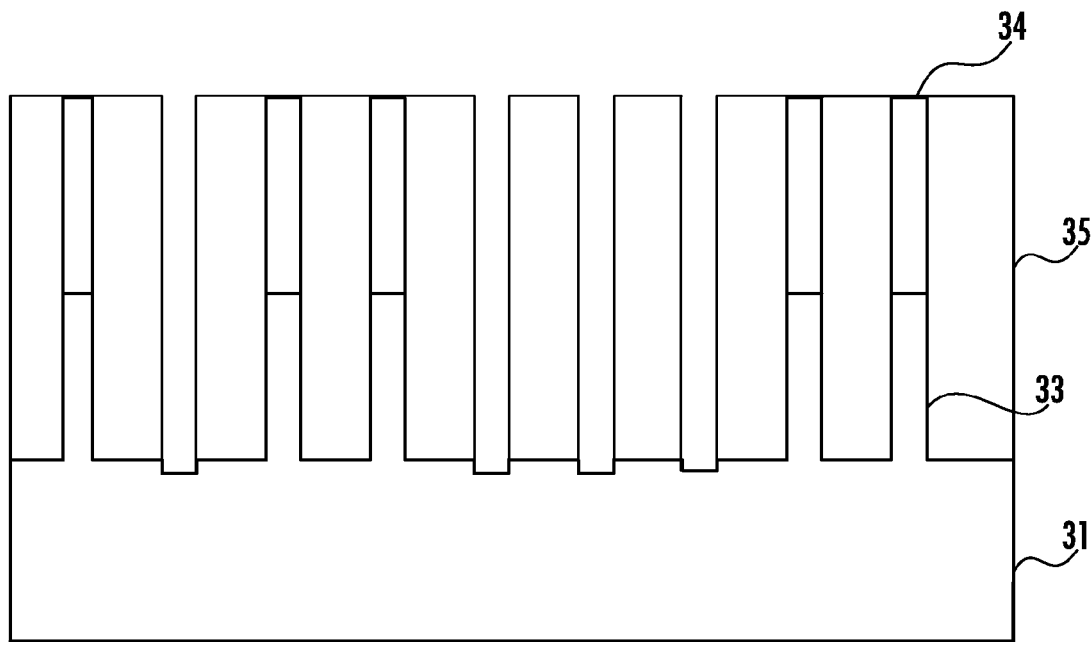

Yet, in accordance with the present approach, the exposed residual nitride portions 34 may be etched away, as shown in FIG. 6. By way of example, this may be done using an isotropic etching process, such as a Frontier dry etch process from AMAT. This may be followed by stripping or removal of the photomask 36 (FIG. 7), and then selective etching of the exposed fins 33 using adjacent portions of the oxide 35 and the remaining residual nitride portions 34 as a hard mask (FIG. 8). The etch may extend partially into the silicon substrate 31, as shown in the illustrated example. Thus, despite the potential misalignment or inaccuracy of the photomask 36 deposition, a very precise removal of the desired fins 33 may still be achieved through the two-part removal of the given residual nitride portions 34 and the underlying fins.

Figure 9:
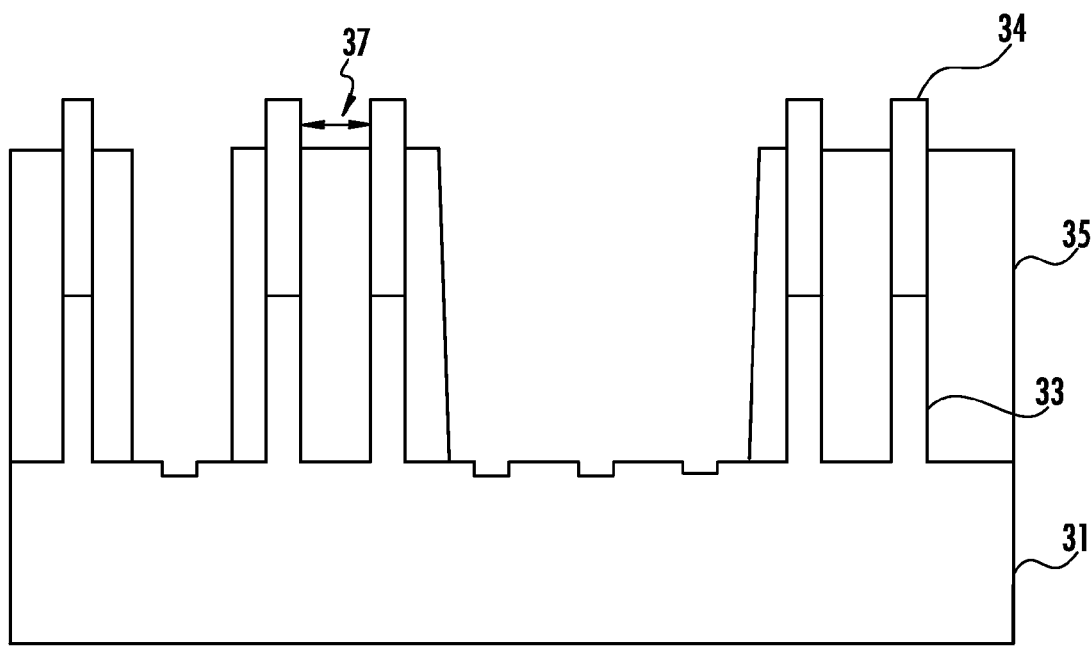
Figure 10:
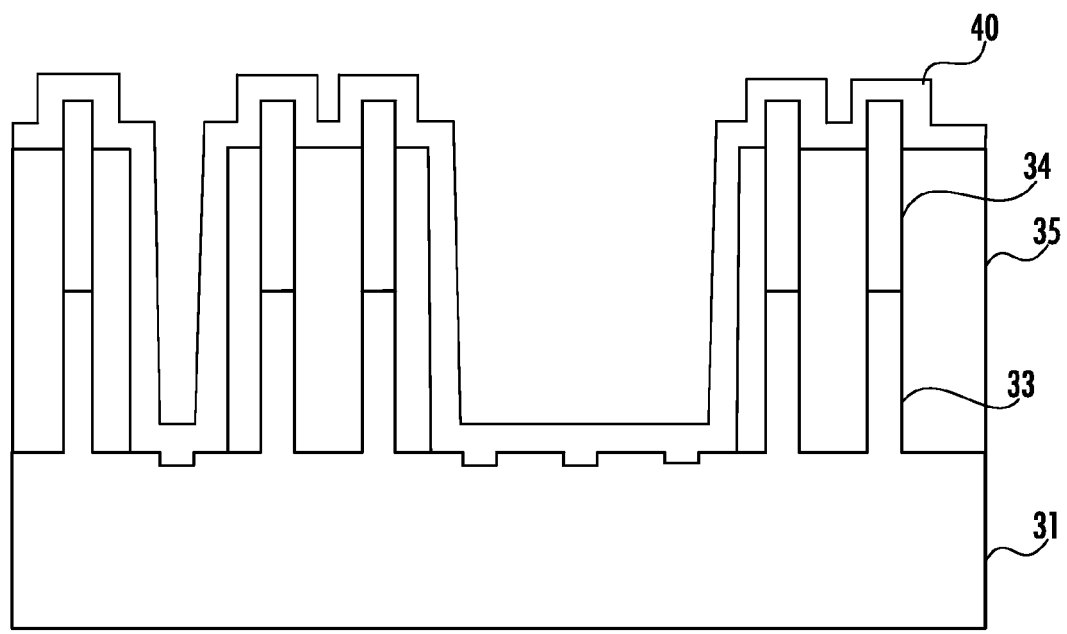

Referring to FIG. 9, an isotropic lateral etch of the oxide 35 may then be performed to widen the trenches where the exposed semiconductor fins 33 were removed. By way of example, a target width of the lateral etch may be slightly more than half of a fin-to-fin spacing 37, which may be in a range of about 10 nm to 20 nm, for example, although other spacings may be used in different embodiments. Where multiple contiguous fins are removed, this creates a wider gap or trench compared to a single fin removal, as seen in FIG. 9. An epitaxial protection layer 40 (e.g., $Al_2O_3$) may then be deposited or formed over the upper surfaces of the oxide 35, residual nitride portions 34, and the substrate 31 where exposed by the above-noted etching, as shown in FIG. 10. Other suitable materials may also be used for the protection layer 40, as will be appreciated by those skilled in the art. For example, such materials may include oxides which are different than the oxide 35 (i.e., different than $SiO_2$ in the present example), as this will allow selective removal of the oxide 35 to expose portions of the protection layer 40, as will be discussed further below.

Figure 11:
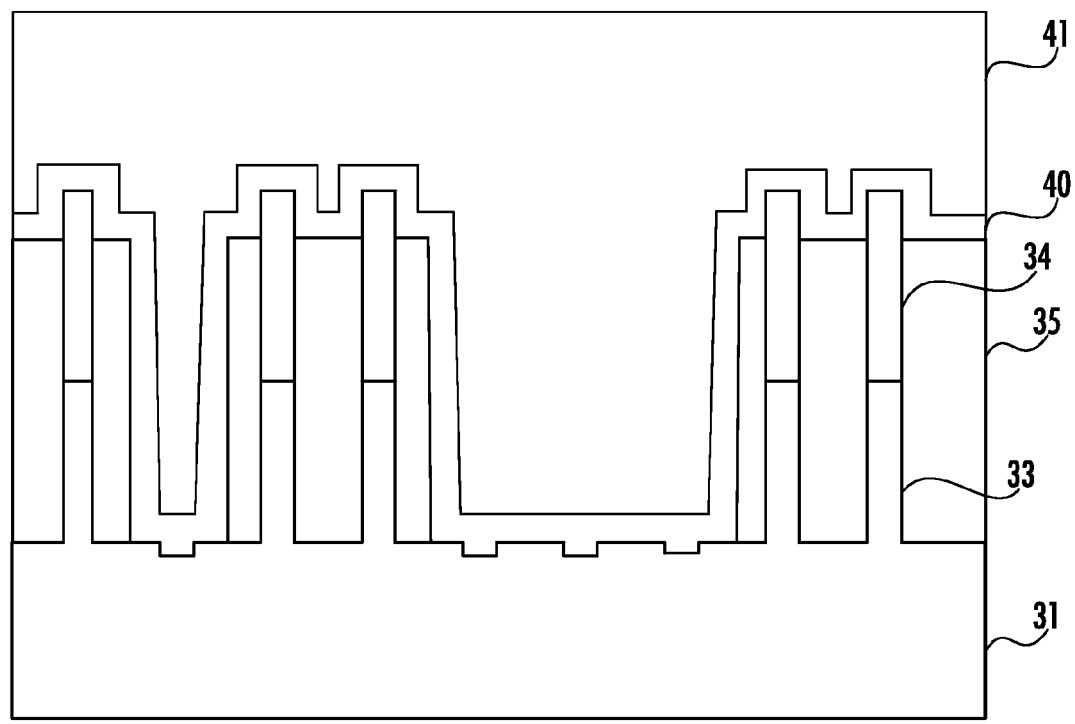
Figure 12:
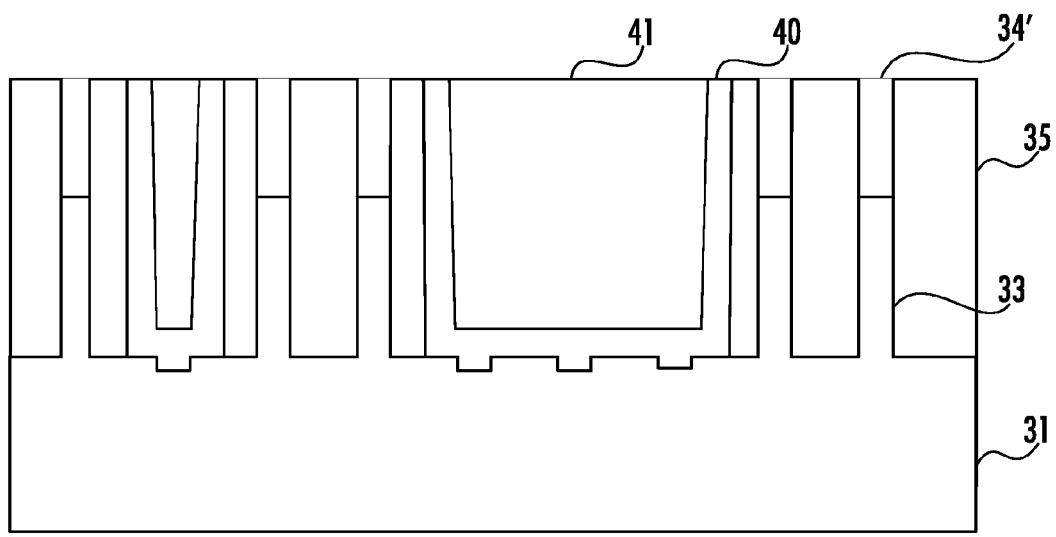
Figure 13:
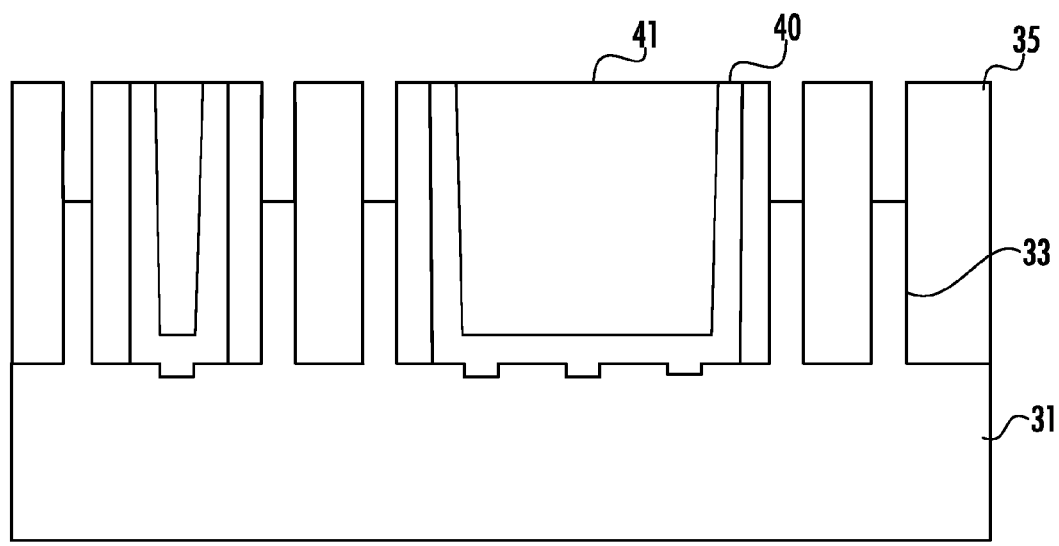
Figure 14:
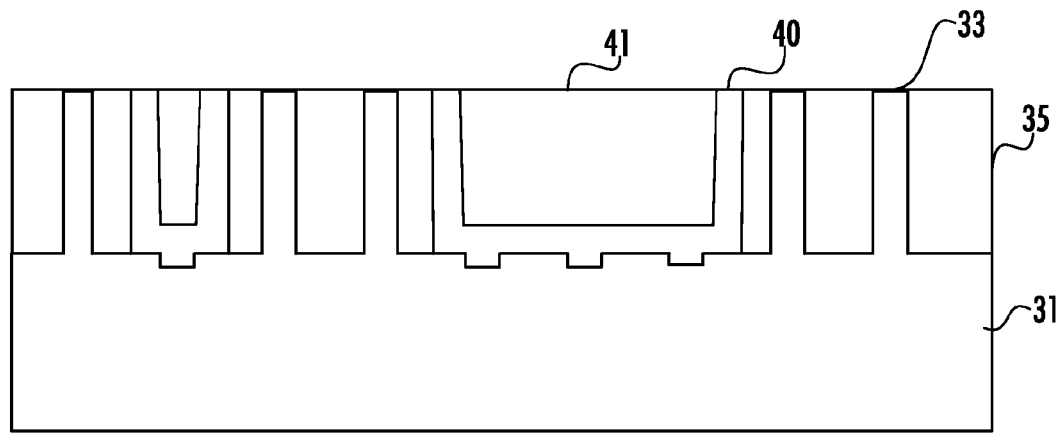
Figure 15:
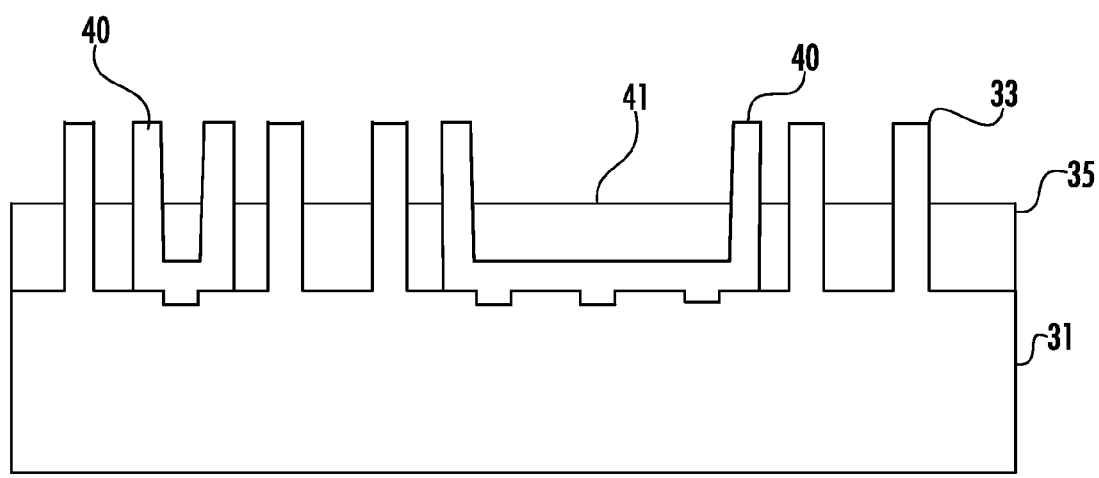

Another oxide 41 (e.g., $SiO_2$) may then be formed or filled over the protection layer 40, followed by oxide planarization and non-selective CMP processing to expose the residual nitride hard mask portions 34, as shown in FIGS. 11 and 12. The residual nitride hard mask portions 34 may then be removed to expose the underlying fins 33, followed by CMP processing which stops at the upper surfaces of the exposed fins, as seen in FIGS. 13 and 14. Further etching back of the oxide 35 exposes upper portions of the fins 33, as well as the protective layer portions 40, as seen in FIG. 15. In this way, the exposed protective layer portions 40 serve as "dummy" dielectric fins which help prevent lateral epitaxial shorts between adjacent devices, as will be appreciated by those skilled in the art. In the final device 30 shown in FIG. 1, source and drain regions 50, 51 are provided for each respective device, as well as a gate line 52 which extends across the fins 33 and "dummy" dielectric fins 40.

Figure 16:
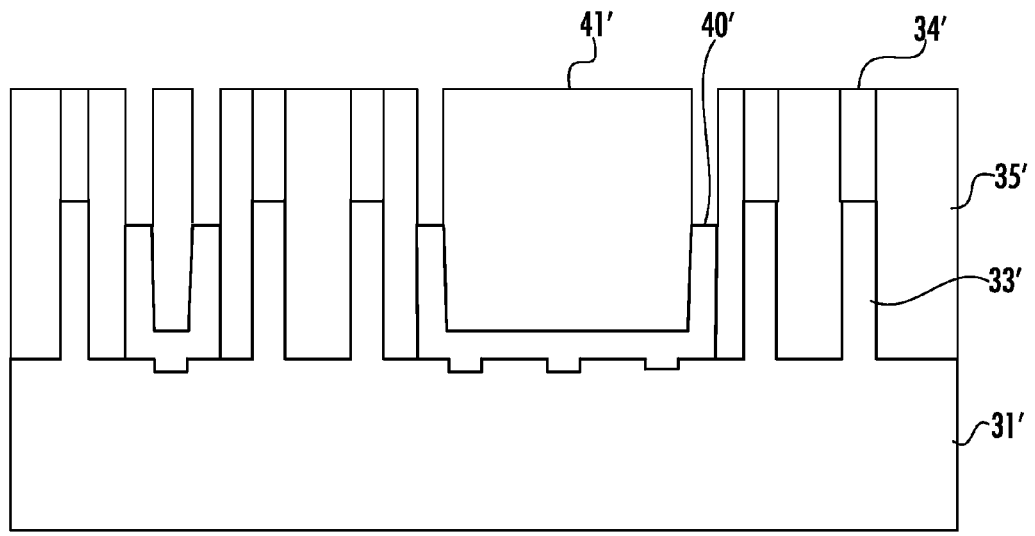
FIGS. 16-19 are a series of cross-sectional views, also taken along line A-A of FIG. 1, and illustrating another approach for making the semiconductor FINFET device.
Figure 17:
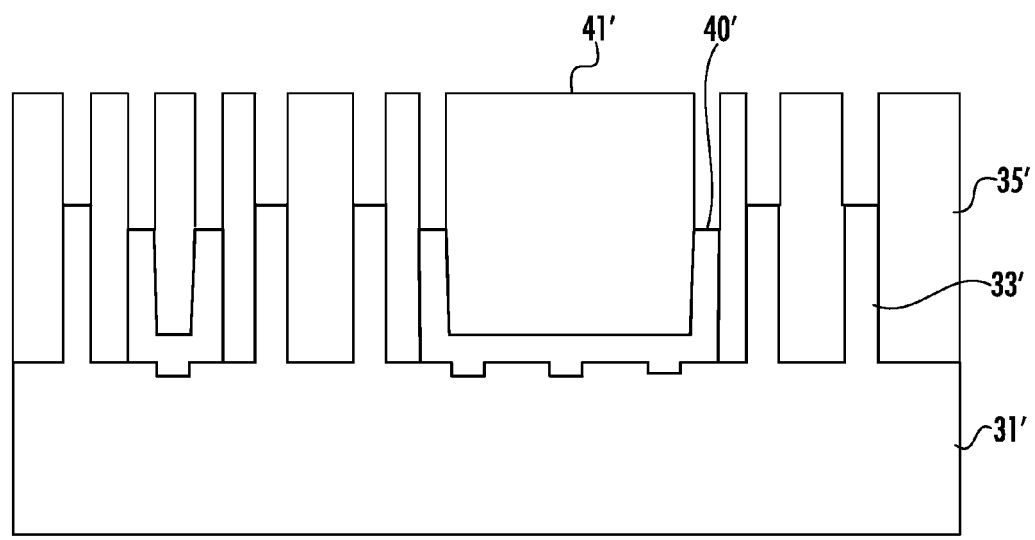
Figure 18:
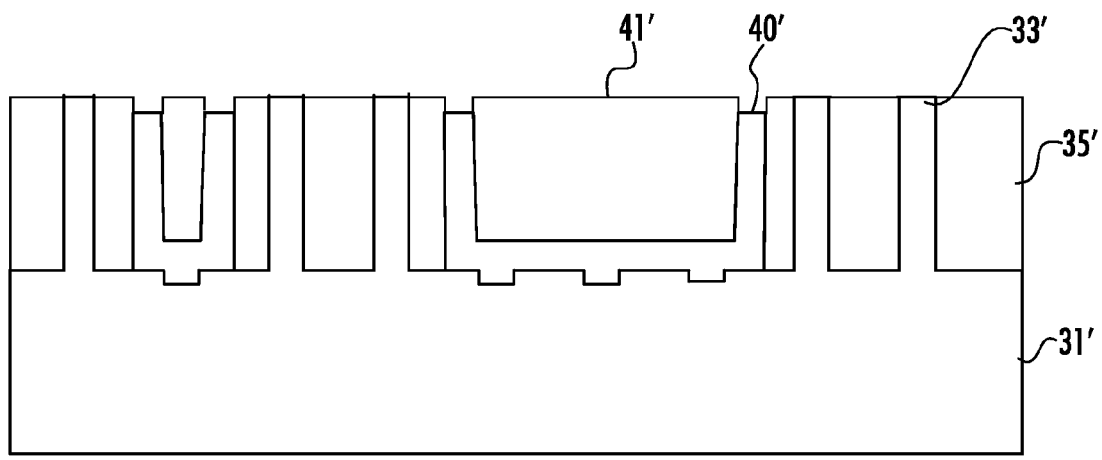
Figure 19:
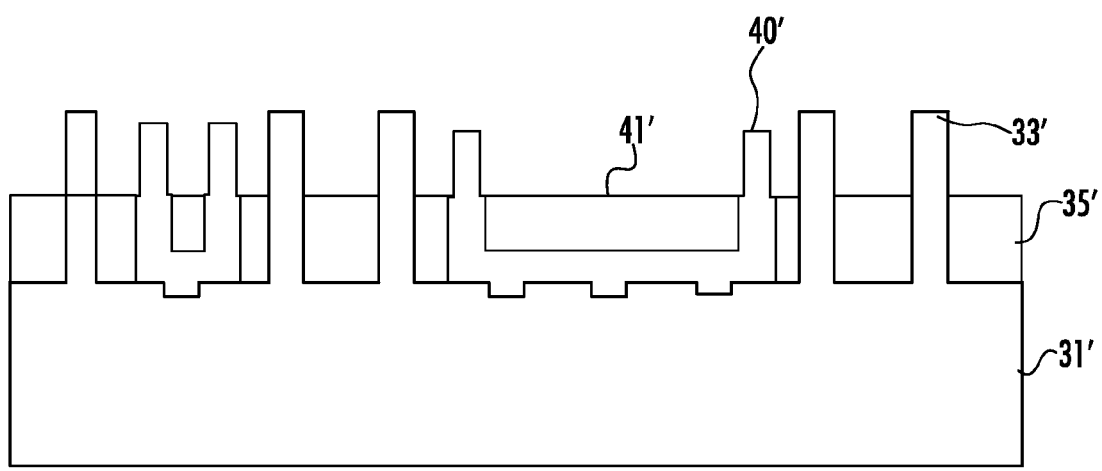

In accordance with another embodiment, the oxide 40' (e.g., $Al_2O_3$) may be etched back (FIG. 16) prior to removal of the residual nitride portions 34' (FIG. 17). CMP processing of the oxide 35', which stops at the fins 33', may then be performed (FIG. 17). The oxide 35' is etched back to reveal or expose upper portions of the fins 33' and "dummy" oxide fins 40', as seen in FIG. 19.

While the above-noted embodiments are described with a silicon substrate and fins, it will be appreciated that other suitable semiconductor materials may also be used. By way of example, such materials may include SiGe, Ge, III-V materials, etc. Moreover, in some embodiments, the fins 33, 33' may be formed into nanowire fins, such as by the approach described in U.S. patent application Ser. No. 14/182,601 filed Feb. 18, 2014, which is assigned to the present Applicant and is hereby incorporated herein in its entirety by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming, above a substrate, a plurality of laterally spaced-apart semiconductor fins;
   forming regions of a first dielectric material between the laterally spaced-apart semiconductor fins;
   selectively removing at least one intermediate semiconductor fin from among the plurality of semiconductor fins to define at least one trench between corresponding regions of the first dielectric material; and forming a region of a second dielectric material different than the first dielectric material in the at least one trench to provide at least one isolation pillar between adjacent semiconductor fins.

2. The method of claim 1 wherein selectively removing the at least one intermediate semiconductor fin comprises selectively removing a group of adjacent intermediate semiconductor fins, and wherein the at least one isolation pillar comprises a group of spaced-apart isolation pillars.

3. The method of claim 1 further comprising selectively removing portions of the first dielectric material to widen the at least one trench after selectively removing the at least one intermediate semiconductor fin.

4. The method of claim 1 further comprising removing upper portions of the regions of the first dielectric material so that the semiconductor fins and the at least one isolation pillar extend above the regions of the first dielectric material.

5. The method of claim 1 wherein the first dielectric material comprises silicon dioxide, and wherein the second dielectric material comprises aluminum oxide.

6. The method of claim 1 further comprising forming a gate overlying the semiconductor fins and the at least one isolation pillar.

7. The method of claim 1 further comprising forming a pair of source and drain regions on opposing ends of at least one of the semiconductor fins.

8. The method of claim 1 wherein selectively removing the at least one intermediate semiconductor fin comprises forming a mask layer above the semiconductor fins and exposing the at least one intermediate semiconductor fin, and removing the at least one semiconductor fin through the mask layer.

9. The method of claim 1 further comprising:
forming a respective nitride region over each of the semiconductor fins; and
removing the nitride region over the at least one intermediate semiconductor fin using an isotropic etch prior to removing the at least one intermediate semiconductor fin.

10. The method of claim 1 wherein the plurality of semiconductor fins comprise silicon.

11. The method of claim 1 wherein the substrate comprises a semiconductor substrate.

12. A method for making a semiconductor device comprising:
forming, above a substrate, a plurality of laterally spaced-apart semiconductor fins;
forming regions of a first dielectric material between the laterally spaced-apart semiconductor fins;
selectively removing at least one intermediate semiconductor fin from among the plurality of semiconductor fins to define at least one trench between corresponding regions of the first dielectric material;
selectively removing portions of the first dielectric material to widen the at least one trench; and
forming regions of a second dielectric material different than the first dielectric material in the at least one trench to provide a group of spaced-apart isolation pillars between adjacent semiconductor fins.

13. The method of claim 12 further comprising removing upper portions of the regions of the first dielectric material so that the semiconductor fins and isolation pillars extend above the regions of the first dielectric material.

14. The method of claim 12 wherein the first dielectric material comprises silicon dioxide, and wherein the second dielectric material comprises aluminum oxide.

15. The method of claim 12 further comprising forming a gate overlying the semiconductor fins and the at least one isolation pillar, and forming a pair of source and drain regions on opposing ends of at least one of the semiconductor fins.

16. The method of claim 12 further comprising forming a pair of source and drain regions on opposing ends of at least one of the semiconductor fins.

17. The method of claim 12 wherein selectively removing the at least one intermediate semiconductor fin comprises forming a mask layer above the semiconductor fins and exposing the at least one intermediate semiconductor fin, and removing the at least one semiconductor fin through the mask layer.

18. A method for making a semiconductor device comprising:
forming, above a substrate, a plurality of laterally spaced-apart silicon fins;
forming regions of silicon oxide between the laterally spaced-apart silicon fins;
selectively removing at least one intermediate silicon fin from among the plurality of silicon fins to define at least one trench between corresponding regions of the silicon oxide; and
forming a region of aluminum oxide in the at least one trench to provide at least one isolation pillar between adjacent silicon fins.

19. The method of claim 18 wherein selectively removing the at least one intermediate silicon fin comprises selectively removing a group of adjacent intermediate silicon fins, and wherein the at least one isolation pillar comprises a group of spaced-apart isolation pillars.

20. The method of claim 18 further comprising selectively removing portions of the silicon oxide to widen the at least one trench after selectively removing the at least one intermediate silicon fin.

21. The method of claim 18 further comprising removing upper portions of the regions of the silicon oxide so that the silicon fins and the at least one isolation pillar extend above the regions of the silicon oxide.

22. The method of claim 18 further comprising forming a gate overlying the silicon fins and the at least one isolation pillar.

23. The method of claim 18 further comprising forming a pair of source and drain regions on opposing ends of at least one of the silicon fins.

* * * * *